(12) United States Patent
Kane

(10) Patent No.: US 6,369,404 B1
(45) Date of Patent: Apr. 9, 2002

(54) ELECTRON DEVICES FOR SINGLE ELECTRON AND NUCLEAR SPIN MEASUREMENT

(75) Inventor: Bruce Kane, Silver Spring, MD (US)

(73) Assignee: Unisearch Limited, Kensington (AU)

(*) Notice: Subject to any disclaimer, the term of this patent is extended or adjusted under 35 U.S.C. 154(b) by 0 days.

(21) Appl. No.: 09/486,414
(22) PCT Filed: Sep. 17, 1998
(86) PCT No.: PCT/AU98/00778
§ 371 Date: Jun. 23, 2000
§ 102(e) Date: Jun. 23, 2000
(87) PCT Pub. No.: WO99/14614
PCT Pub. Date: Mar. 25, 1999

(30) Foreign Application Priority Data

Sep. 17, 1997 (AU) .............................. PO 9268

(51) Int. Cl.[7] .............................. H01L 29/06
(52) U.S. Cl. .............................. 257/14; 257/24; 324/71.5
(58) Field of Search .............................. 257/9, 14, 24, 257/421; 324/71.5

(56) References Cited

U.S. PATENT DOCUMENTS

| | | |
|---|---|---|
| 5,530,263 A | 6/1996 | DiVincenzo |
| 5,608,229 A | 3/1997 | Mukai et al. |
| 5,671,437 A | 9/1997 | Taira |
| 5,793,091 A | 8/1998 | Devoe |

OTHER PUBLICATIONS

Kane, B., "A silicon–based nuclear spin quantum computer", Nature, vol. 393, pp. 133–137, May 14, 1998.

Chuang, I., et al., "Experimental realization of a quantum computer", Nature, vol. 393, pp. 143–146, May 14, 1998.

Kostychenko, V., "Spin–wave flucatuations in a quantum computer based on spin–polarized electrons", Russian Microelectronics, vol. 25, No. 5, pp. 327, 328, 329.

Di Vincenzo, D., "Quantum computation", Science, vol. 270, pp. 255–261, Oct. 13, 1995.

Lloyd, S., "A potentially realizable quantum computer", Science, vol. 261, pp. 1569–1571, Sep. 17, 1993.

Feher G., "Electron spin resonance experiments on donors in silicon . . . ", Physical Review, vol. 114, No. 5, pp. 1219–1244, Jun. 1, 1959.

Waugh, J., et al., "Mechanism of nuclear spin–lattice relaxation at very low temperatures", Physical Review, vol. 37, No. 8, pp. 4337–4339, Mar. 15, 1988.

*Primary Examiner*—Sara Crane
(74) *Attorney, Agent, or Firm*—Rockey, Milnamow & Katz, Ltd.

(57) ABSTRACT

An electron device for single spin measurement, comprising: a semiconductor substrate into which at least one donor atom is introduced to produce a donor nuclear spin electron system having large electron wave functions at the nucleus of the donor atom. An insulating layer above the substrate. A first conducting gate on the insulating layer above the donor atom to control the energy of the bound electron state at the donor. A second conducting gate on the insulating layer adjacent the first gate to generate at least one additional electron in the substrate. In use, a single electron is bound to the donor, and the donor atom is weakly coupled to the additional electron(s) in the substrate. The gates are biased so that the additional electron(s) in the substrate will move to the donor, but only if the spins of the electrons and the donor electron or nucleus are in a relationship which permits the movement.

26 Claims, 6 Drawing Sheets

ELECTRON DEVICES FOR SINGLE ELECTRON AND NUCLEAR SPIN MEASUREMENT

TECHNICAL FIELD

Electrons and some nuclei possess a quantized unit of angular momentum called "spin". This invention concerns electron devices for single electron and nuclear spin measurement.

The $|\uparrow\downarrow\rangle$ notation is used here to represent the electron spin state, and the $|01\rangle$ notation the nuclear state. For simplicity, normalization constants are omitted.

In two electron systems, the electron spins may be aligned (total spin angular momentum =1) in triplet states ($|\downarrow\downarrow\rangle$, $|\uparrow\uparrow\rangle$, and $|\uparrow\downarrow+\downarrow\uparrow\rangle$) or opposed (total spin angular momentum=0) in a singlet state ($|\uparrow\downarrow-\downarrow\uparrow\rangle$). Similarly the nuclear spins may be aligned or opposed. In the $|\downarrow\downarrow 11\rangle$ state, all spins point in the same direction.

BACKGROUND ART

In the laboratory, large numbers ($\geq 10^{23}$) of electron and nuclear spins are regularly probed using traditional magnetic resonance techniques.

There are important applications for devices and techniques that can measure a single electron or nuclear spin. For example, magnetic resonance experiments could be performed on a single atom or molecule and the local environment (electric and magnetic fields) could be measured with great precision. Alternatively, single electron or nuclear spins could be used as qubits in a quantum computer. Single spin measuring devices would be required in the computer to initialize and to measure the single-spin qubits.

SUMMARY OF THE INVENTION

A first aspect of the invention is an electron device for single spin measurement, comprising:

A semiconductor substrate into which at least one donor atom is introduced to produce a donor nuclear spin electron system having large electron wave functions at the nucleus of the donor atom.

An insulating layer above the substrate.

A first conducting gate on the insulating layer above the donor atom to control the energy of the bound electron state at the donor.

A second conducting gate on the insulating layer adjacent the first gate to generate at least one electron in the substrate.

In use, a single electron is bound to the donor, and the donor atom is weakly coupled to the at least one electron in the substrate. The gates are biased so that the at least one electron in the substrate will move to the donor, but only if the spins of the at least one electron and the donor are in a relationship which permits the movement.

The arrangement is such that detection of current flow, or even movement of a single electron, in the device constitutes a measurement of a single spin.

The motion of a single electron may be detected by probing the system capacitively, for instance by using single electron capacitance probes, and any metallic lead can couple to the system, with no special requirement for spin-polarized electrons. Alternatively, the charge motion may be detected by single electron tunnelling transistor capacitance electrometry.

A first example of the invention is an electron device for single electron spin measurement, comprising:

A semiconductor substrate into which at least one donor atom is introduced to produce a donor nuclear spin electron system having large electron wave functions at the nucleus of the donor atom.

An insulating layer above the substrate.

A conducting A-gate on the insulating layer above the donor atom to control the energy of the bound electron state at the donor.

A conducting E-gate on the insulating layer on either side of the A-gate to generate a reservoir of spin polarised electrons at the interface between the substrate and the insulating layer.

In use the donor atom is weakly coupled to the two reservoirs of spin-polarized electrons, both reservoirs have the same polarisation, and a single electron, whose spin is to be determined, is bound to the donor. The E-gates are biased so that current will flow between them, but only if the spin on the donor is opposite to the spin polarization in the reservoirs. In this case one electron at a time from one of the reservoirs may join the same quantum state (with opposite spin) as the bound electron, and then depart the donor to the other reservoir. But when the electrons are all polarized in the same direction no current can flow since the electrons from the reservoir cannot enter the same quantum state as the bound electron.

In another example, there are two donors with 'A-gates' located above each of them, and an 'E-gate' located between them. Electrons are bound to the two, positively charged, donors, and the donors are spaced sufficiently close to each other so that electron transfer, or exchange coupling, between them is possible.

In use, an increasing potential difference is applied to the two A-gates and at some point it will become energetically favorable for both electrons to become bound to the same donor, but only if the electrons are in a mutual singlet state. The signature of the singlet state, charge motion between donors as a differential bias is applied to the A-gates, can be detected externally.

Another example of the invention is an electron device for single nuclear spin measurement, comprising:

A semiconductor substrate into which at least one donor atom is introduced to produce a donor nuclear spin electron system having large electron wave functions at the nucleus of the donor atom.

An insulating layer above the substrate.

A conducting A-gate on the insulating layer above the donor atom to control the energy of the bound electron state at the donor.

A conducting E-gate on the insulating layer on either side of the A-gate to generate a reservoir of electrons at the interface between the substrate and the insulating layer.

Where all the electron spins are polarized in the same direction, and the donor is a nucleus with spin, coupled to the electrons by the hyperfine interaction. The E-gates are biased so that current will flow between them, but only if the the nuclear spin is initially opposed to the electron spins. The process involves the electron coming from the reservoir and exchanging its spin with the spin of the nucleus so that its spin is then opposed to the donor electron and can form a singlet with it. The arrangement is such that detection of movement of a single electron in the device constitutes a measurement of the nuclear spin on the donor.

Alternatively, since the transport of an electron onto the donor and off again involves two spin flips, a current flow across the donor preserves nuclear spin polarisation, and current flow is turned on or off depending on the orientation of the nuclear spin on the donor.

The electrons may, for example, be polarised by being at low temperature in a large magnetic field.

The conducting E-gate on the insulating layer on either side of the A-gate may generate a 2-Dimensional electron gas at the interface between the substrate and the insulating layer.

In use, the E-gates may be biased so that only $|\downarrow\rangle$ electrons are present on both sides of the donor atom. And the A-gate may be biased so that $E_F$ lies at the energy of the two electron bound state at the donor (the D$^-$ state).

The host may contain only nuclei with spin I=0, such as Group IV semiconductors composed primarily of I=0 isotopes and purified to contain only I=0 isotopes. Si is an attractive choice for the semiconductor host. The donor can be $^{31}$P.

The gates may be formed from metallic strips patterned on the surface of the insulating layer. A step in the insulating layer over which the gates cross may serve to localise the gates electric fields in the vicinity of the donor atoms.

The state of a given spin system may be inferred from the measurement if the system is prepared by adiabatic changes to the spin state energies before the measurement takes place, to ensure that the measurement outcome is determined by the initial state of a given spin.

Another aspect of the invention is a procedure for the preparation of spin states in a two electron system, which comprises the following steps:

First, manipulate the A-gates so that a first spin has larger energy than a second spin.

Next, apply bias to the intermediary E-gate to turn on the exchange coupling between the two electrons. As the exchange coupling increases, the lower energy state of the two states with a single spin pointing up evolves into the singlet state which at large E will have the lowest energy.

Then bring the A-gates back into balance so that the ground state is an exact singlet.

A measurement will yield the result for a singlet state if and only if the original spin configuration was ($\downarrow\uparrow$). After the measurement the two spins can be returned to their initial configuration by reversing the sequence of adiabatic manipulations.

If the state of the first spin is unknown, two measurements can be performed in sequence on the spins, with the second beginning with a spin flip of the first spin. The second measurement will produce a singlet result if and only if the initial state, prior to the first measurement, was ($\uparrow\uparrow$).

Examples of the invention can be incorporated into a quantum computer which has:

A semiconductor substrate into which donor atoms are introduced to produce an array of donor nuclear spin electron systems having large electron wave functions at the nucleus of the donor atoms.

An insulating layer above the substrate.

Conducting A-gates on the insulating layer above respective donor atoms to control the strength of the hyperfine interactions between the donated electrons and the donor atoms' nuclear spins, and hence the resonance frequency of the nuclear spins of the donor atoms.

Conducting J-gates on the insulating layer between A-gates to turn on and off electron mediated coupling between the nuclear spins of adjacent donor atoms.

Where, the nuclear spins of the donor atoms are the quantum states or "qubits" in which quantum information is stored and manipulated by selective application of voltage to the A-and J-gates and selective application of the alternating magnetic field to the substrate.

A cooling means to maintain the substrate cooled to a temperature sufficiently low. In operation the temperature of the device may be below 100 millikelvin (mk) and will typically be in the region of 50 mK. The device is non-dissipative and can consequently be maintained at low temperatures during computation with comparative ease. Dissipation will arise external to the computer from gate biasing and from eddy currents caused by the alternating magnetic field, and during polarisation and detection of nuclear spins at the beginning and end of the computation. These effects will determine the minimum operable temperature of the computer.

A source of constant magnetic field having sufficient strength to break the two-fold spin degeneracy of the bound state of the electron at the donor. The constant magnetic field may be required to be of the order of 2 Tesla. Such powerful magnetic fields may be generated from superconductors.

The combination of cooling and magnetic field ensures the electrons only occupy the nondegenerate lowest spin energy level.

A source of alternating magnetic field of sufficient force to flip the nuclear spin of donor atoms resonant with the field, and means to selectively apply the alternating magnetic field to the substrate. And means to selectively apply voltage to the A-and J-gates.

The E-gates may be separate from the J-gates, or they may be incorporated in them.

Single electron tunnelling transistors (SETTs) are currently the most sensitive devices developed to measure small charges and small charge motions. SETTs contain a small "island" electrode located between source and drain electrodes. Current flows from source to drain only if there is an energy level in the island equal to the Fermi level in the source and drain. A "Coulomb blockade" results when no energy level is available on the island through which the electrons can tunnel. The extreme sensitivity of SETTs will occur when the island is extremely small and when the device is at low temperature.

The metal electrodes may lie on the top of the Si substrate, containing P donors located below the electrodes. Motion of charge between the donors changes the potential of the SETT island, and hence its conductance. The conductance of the SETT, when the gate is biased appropriately, constitutes a measurement from which electron or nuclear spin can be inferred, using arguments presented above.

One of the A-gates may also be the island of a SETT. In the scenario where the devices discussed above are used to measure and initialize spins in a quantum computer, many SETTs would be necessary to measure many spins simultaneously. The capacitive coupling technique for spin measurement is particularly attractive, since a two dimensional array of spins could be measured using electrodes out of the plane of the spins, and every spin in the array could be independently measured by a separate SETT device. Thus, this approach to spin measurement is well suited to future large scale quantum computation.

BRIEF DESCRIPTION OF THE DRAWINGS

Examples of the invention will now be described with reference to the accompanying drawings, in which:

FIG. 1 is a schematic diagram of a donor atom weakly coupled to electron spin-polarized reservoirs.

BEST MODES FOR CARRYING OUT THE INVENTION

The Pauli Exclusion Principle (that two electrons can occupy the same quantum state if and only if they have opposite spin) manifests itself in systems of two or more electrons. Some examples of the invention rely upon the exclusion principle to measure spin by detecting charge motion into and out of two electron systems. Because of the Pauli Principle, the energy levels of two electron systems differ, depending on whether the spins are aligned (triplet states) or opposed (singlet states).

For clarity, the following discussion is restricted to discussing only the simplest two electron systems encountered in condensed matter systems: the system of two electrons bound to a single positive charge (called a D$^-$ center when the positive charge is a donor in a semiconductor). However, it should be understood that any two-electron system will have similar properties.

In general, the only bound state of a D$^-$ center is a singlet where the electron spins are opposed; the triplet states, where the spins are aligned, lie in the continuum. In the specific condensed matter system of Si, the D$^-$ center, consisting of two singlet electrons bound to a P donor, has a bound state energy of −1.7 meV.

Single Electron Spin Valve

Figure 1A:
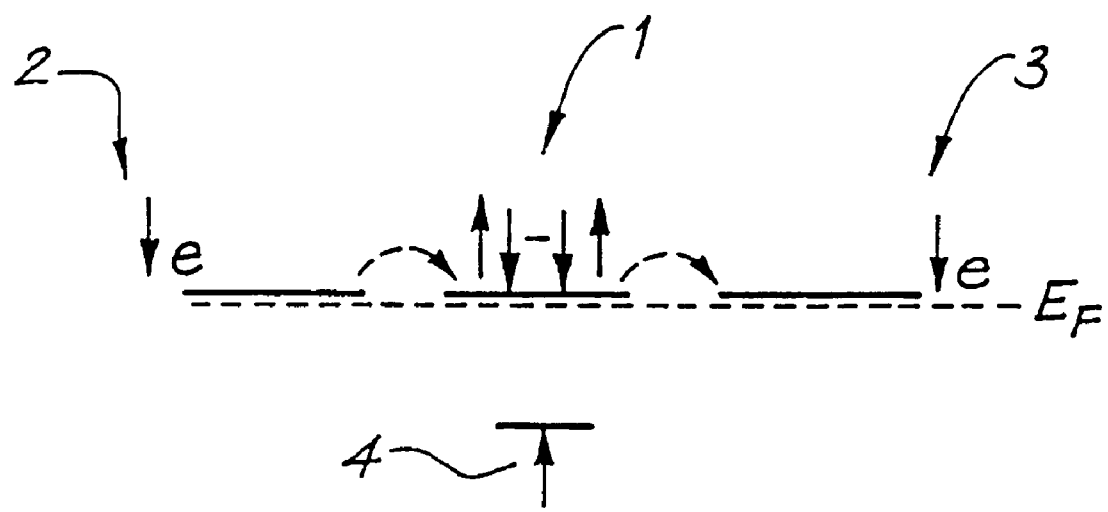
In FIG. 1a, the electron on the donor is polarized oppositely to the electrons in the reservoir. Current can flow across the donor by tunneling through a singlet ($|\uparrow\downarrow - \downarrow\uparrow\rangle$) state.
Figure 1B:
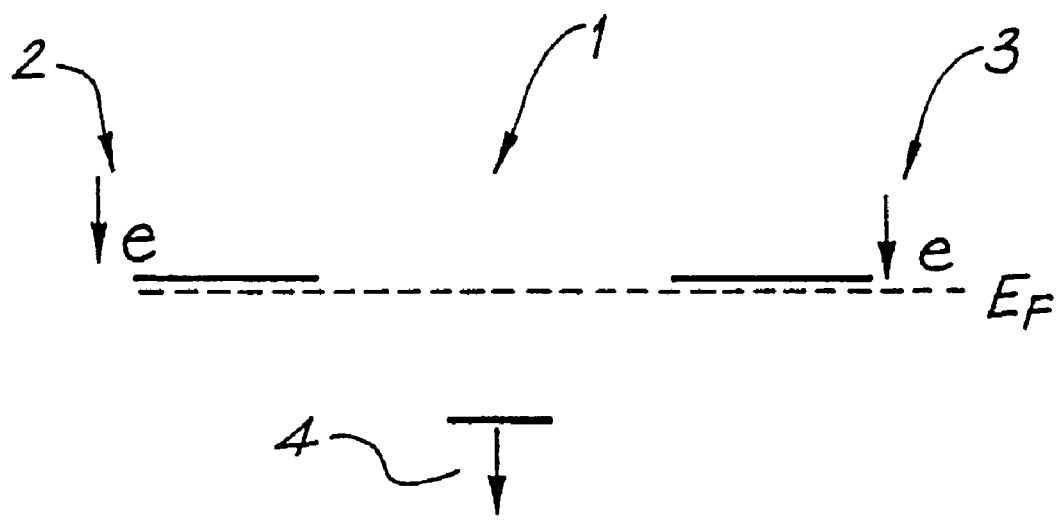
In FIG. 1b, the electron on the donor is polarized in the same direction as the electrons in the reservoirs, and current is unable to flow.

Perhaps the simplest conceptual device for single spin measurement is shown in FIG. 1. A single donor atom 1 is weakly coupled to two reservoirs of spin-polarized electrons 2 and 3. For example, the electrons may be polarised by being at low temperature (T) in a large magnetic field (B). A single electron 4, whose spin is to be determined, is bound to the donor. To operate the device, the energy of the donor D$^-$ center is made equal, or resonant with, the Fermi energy ($E_F$) of the reservoirs. Since charge transfer across the donor must go through the singlet D$^-$ state, current will only flow, as indicated in FIG. 1a, if the spin on the donor is opposite to the spin polarization in the reservoirs. When the conditions are appropriate an electron from one of the reservoirs may join the same quantum state (with opposite spin) as the bound electron, and then depart the donor to the other reservoir. When the electrons are all polarized in the same direction no current can flow since the electrons from the reservoir cannot enter the same quantum state as the bound electron, as indicated in FIG. 1b. The detection of current flow in the device constitutes a measurement of the single electron spin on the donor.

Figure 2A:
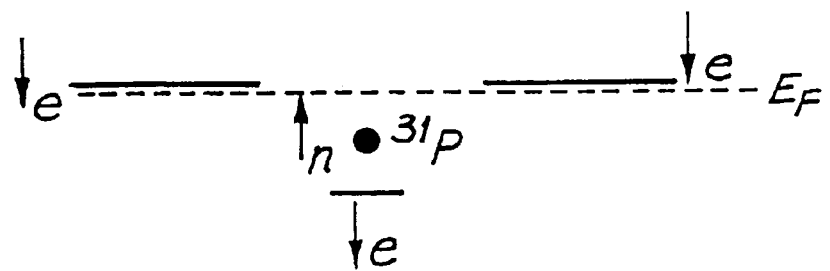
In FIG. 2a, the spin on the donor nucleus is polarized oppositely to the spin on all the electrons and this permits current to flow by an electron from a reservoir exchanging spin with the donor nucleus to arrive at the situation shown in FIG. 2b.
Figure 2B:
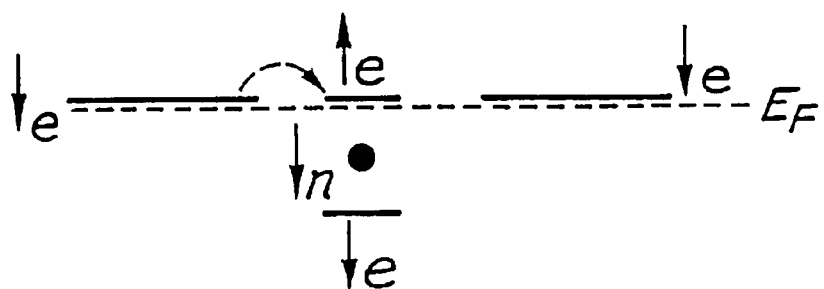
In FIG. 2b, the spin of the donor nucleus has been flipped, and an electron has passed from the reservoir to the nucleus where it is oppositely polarized to the existing electron. The electron that has been passed to the nucleus can pass off to the other reservoir by again exchanging spin with the donor nucleus. This results in the situation shown in FIG. 2c where one electron has passed from the reservoir on the left to the reservoir on the right and the donor nucleus spin has flipped twice to return to its initial condition.
Figure 2C:
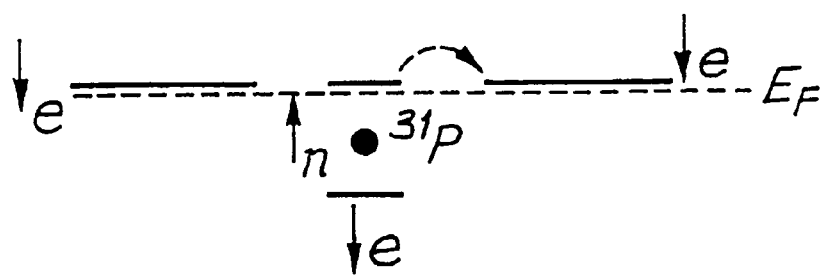
FIG. 2 is a schematic diagram of a donor atom weakly coupled to electron spin polarized reservoirs. In this case the electrons in the reservoirs and on the donor are polarized in the same direction.

This assumes that there is no mechanism present to "flip" reservoir electrons initially pointing in the same direction as the donor electron so that they can occupy the D$^-$ center and traverse between the reservoirs. If the donor is a nucleus with spin, coupled to the electrons by the hyperfine interaction, such a process can occur and will enable the nuclear spin to be measured in appropriate circumstances. The process involves the electron coming from the reservoir and exchanging its spin with the spin of the nucleus so that its spin is then opposed to the donor electron and can form a singlet with it. In FIG. 2a, all the electron spins are polarized in the same direction (again, prepared by an environment with low T and large B.) Current can now cross the junction if and only if tho nuclear spin is initially opposed to the electron spins. This "single nucleus spin valve" illustrates how nuclear spins, coupled to electrons by the hyperfine interaction, can be measured in devices similar to those measuring single electron spins.

Single Spin Measurement using Capacitive Techniques

These single spin valve devices, although illustrative, suffer from several practical deficiencies. In particular, they require polarized electron spin reservoirs. A small contamination of the reservoirs with electrons of the wrong spin will lead to device malfunction. Also, the need for reservoirs may greatly limit their value in certain applications. Both of these limitations can be circumvented if a closed system is probed, so spin transfer to and from the system is entirely eliminated. If the system is probed capacitively, any metallic lead can couple to the system, with no special requirement for spin-polarized electrons.

Figure 3:
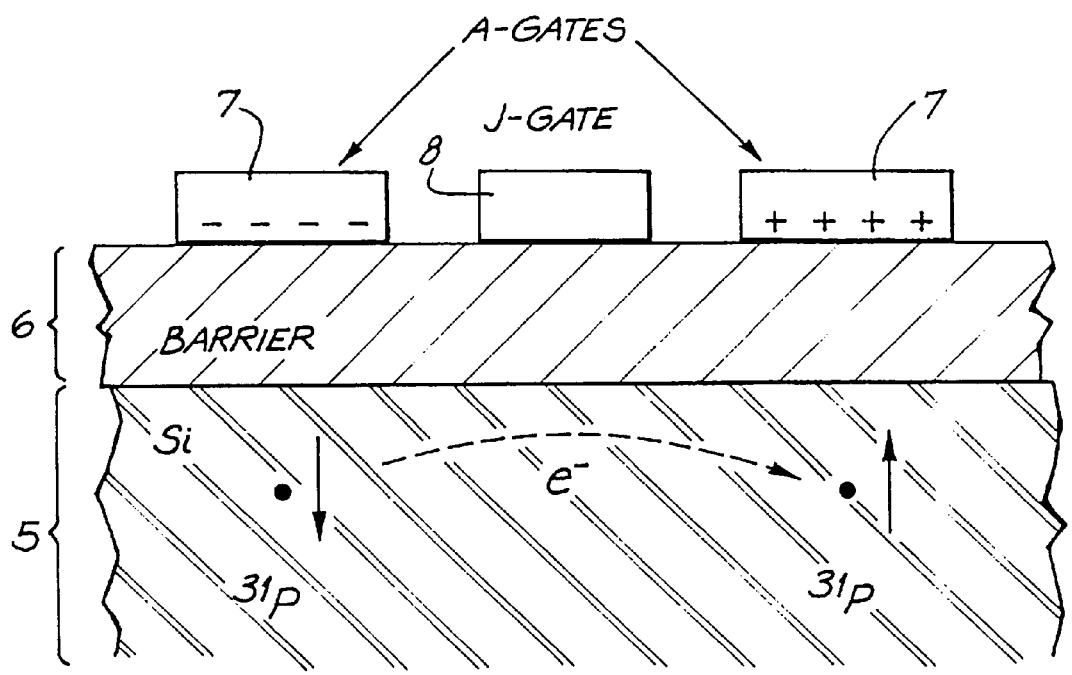
FIG. 3 is a schematic diagram of two donors located in a semi-conductor beneath a metal barrier, on top of which are located metal gates used to probe the spin system. A-gates are located above the donors, while a E-gate is located between the donors. By biasing the A-gates above the donors appropriately, it can become energetically favourable for both electrons to become bound to the same donor, a state that can only be singlet. Thus, the detection of charge motion between the two donors can be detected by changes in the potential on the A-gates, and can be used to infer the spin of the electrons.

Once again, for simplicity and clarity discussion is confined to a two-electron system. Consider two electrons bound to two positively charged donors, spaced sufficiently close to each other so that electron transfer, or exchange coupling, between the donors is possible. These donors are located in a semiconductor 5 beneath a barrier material 6, on top of which are located the metal gates used to probe the spin system, as shown in FIG. 3. 'A-gates' 7 are located above the donors, while a 'E-gate' 8 is located between the donors.

Such a system can measure spin if a potential difference is applied to the two A-gates. As such a voltage is applied, at some point it will become energetically favorable for both electrons to become bound to the same donor, that is a D$^-$ state. However, as was mentioned above, D$^-$ bound states are only possible if the electrons are in a mutual singlet state The signature of the singlet state, charge motion between donors as a differential bias is applied to the A-gates, can be detected externally by single electron tunnelling transistor capacitance electrometry.

Preparation of the Spin States for Measurement

This spin detection method distinguishes between singlet and triplet states of a two spin system but cannot measure the state of an individual spin. The state of a given spin system can be inferred from the measurement if the system is appropriately prepared. Here, "preparation" means adiabatic changes to the spin state energies before the measurement takes place that ensure that the measurement outcome is determined by the initial state of a given spin.

The electron spin energies can be slowly varied if the electron g-factor, that is the coefficient relating the applied DC magnetic field to the spin energy splitting, is sensitive to the location of the electron or if a gradient in B is present. Controlling the applied bias to the intermediary E-gate can also control the exchange coupling of the electrons.

Figure 4:
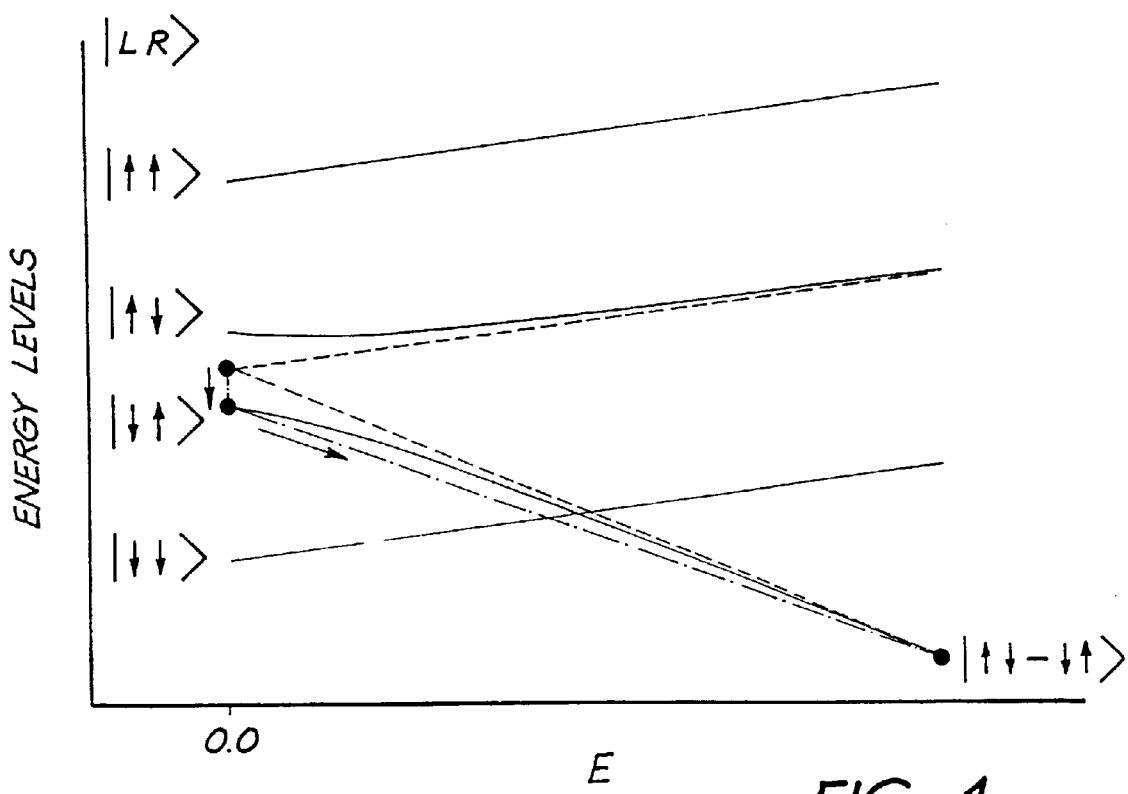
FIG. 4 is an energy level diagram of a two electron system in a magnetic field as a function of the exchange coupling, E. Dashed lines are the energy levels when the spin splitting of the uncoupled electrons are equal, while solid lines are the energies when one electron has greater spin splitting energy than the other. The arrows and dotted lines show an adiabatic sequence of steps that take the $|\downarrow\uparrow\rangle$ state into the spin singlet state $|\uparrow\downarrow - \downarrow\uparrow\rangle$.

To illustrate the procedure, consider the two spins left or 'L' and right or 'R' shown in FIG. 4, with L pointing down and R the spin to be determined, or in other words starting with $|\downarrow ?\rangle$.

First, manipulate the A-gates so that spin L has larger energy than spin R, thus breaking the $\uparrow\downarrow - \downarrow\uparrow$ degeneracy with L($\downarrow$)R($\uparrow$) having the lower energy. Next, turn on the exchange coupling between the two electrons. As the exchange coupling increases, the lower energy state of the two states with a single spin pointing up evolves into the singlet state, which at large E– will have the lowest energy. The A-gates can then be brought back into balance so that the ground state is an exact singlet. A measurement will yield the result for a singlet state if and only if the original spin configuration was L($\downarrow$)R($\uparrow$). After the measurement the two spins can be returned to their initial configuration by reversing the sequence of adiabatic manipulations.

If the state of spin L is unknown, two measurements can be performed in sequence on the spins, with the second beginning with a spin flip of spin L. (Since the A-gates control the resonance frequency of the spins, the L spin can be selectively brought into resonance with an external AC magnetic field and its state inverted.) The second measurement will produce a singlet result if and only if the initial state, prior to the first measurement, was L($\uparrow$)R($\uparrow$). A singlet result for one of the two measurements will occur for R($\uparrow$) regardless of the initial state of spin L.

Adiabatic Approaches to Nuclear Spin Measurement

If electrons are coupled to donor nuclei by the hyperfine interaction, the states of the nuclear spins can determine the outcome of the measurement of the electron spin. This is achieved when the exchange interaction E enables the $|\uparrow\rangle$ and the $|\downarrow\rangle$ states of the electron with the same energy to overlap, enabling resonant electron- nuclear spin exchange. In the case discussed above the exchange can occur when the $|\downarrow\downarrow\rangle$ and the $|\uparrow\downarrow - \downarrow\uparrow\rangle$ levels cross.

Figure 5:
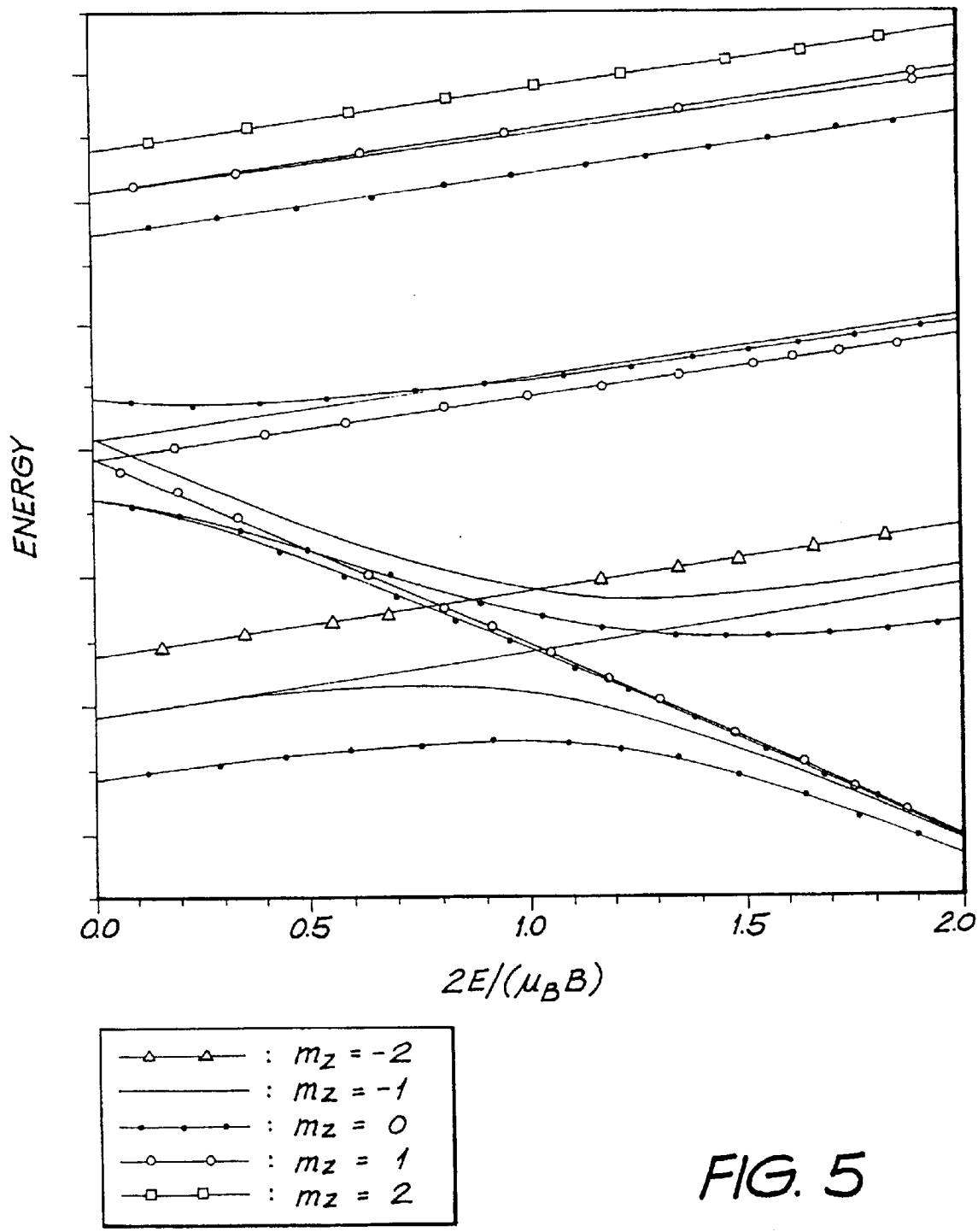
FIG. 5 is a energy level diagram showing the sixteen energy levels of the coupled system of two electrons and two nuclei plotted for the case when the hyperfine coupling constant is equal for each nucleus. The energy splitting of the nuclei relative to the electrons is greatly exaggerated. At E-=0, the four lowest energy levels correspond to $|\downarrow\downarrow\rangle$ electron states. In the coupled system, two of the states evolve into triplets and two evolve into singlets as E-increases.

The sixteen separate energy levels for the coupled system of two electrons and two nuclei are plotted in FIG. 5 as a function of the exchange interaction E-for the case the hyperfine interaction and Zeeman energy (nuclear and electron spin splitting) of the two sites are equal. (In the figure, the magnitude of the nuclear level splitting is much exaggerated compared to the electron level splitting for clarity.) If the two electrons are initially in their ground state (L($\downarrow$) R($\downarrow$)) the two lowest energy nuclear spin levels evolve into the singlet state, while the two highest energy nuclear levels evolve into the triplet state.

Figure 6:
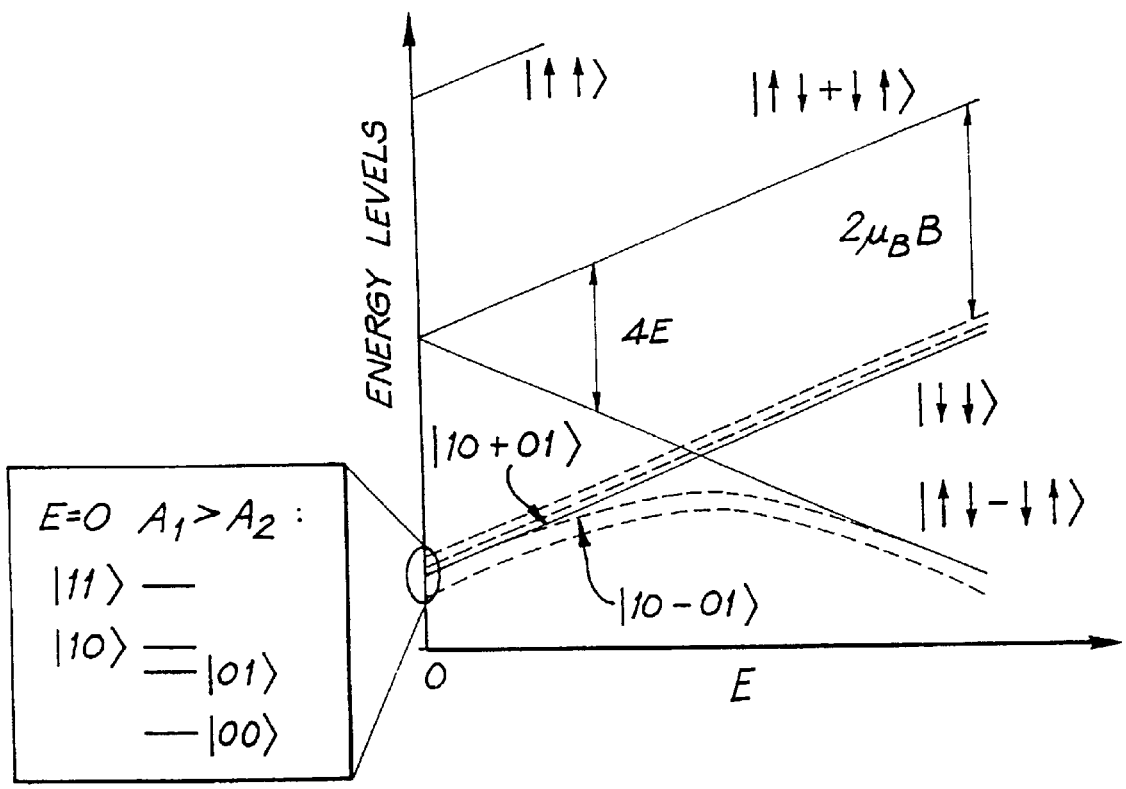
FIG. 6 is an energy level diagram showing the adiabatic evolution of nucleus spin states prior to measurement, achieved by increasing the hyperfine coupling of one nucleus spin to the electrons relative to the other. The state of the left nucleus spin determines whether or not the system will evolve into the electron singlet state.
Figure 7A:
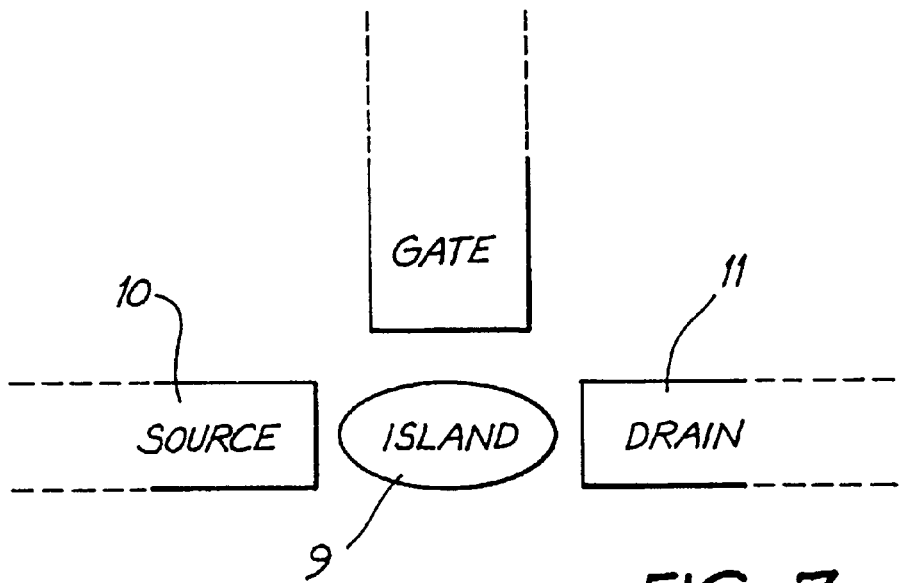
FIG. 7a is a schematic diagram showing the arrangement of the source, drain, gate, and island of a single electron tunneling transistor (SETT).
Figure 7B:
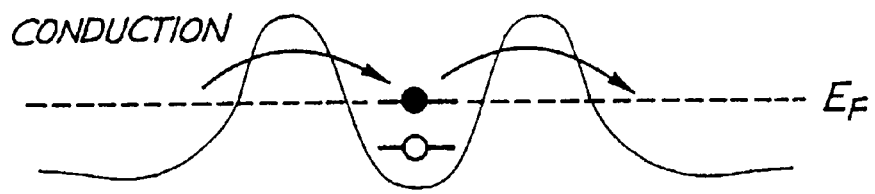
FIG. 7b shows the effect of a Coulomb blockade when there is no energy level equal to the Fermi level in the source and drain available on the island. Conduction takes place when there is an energy level in the island equal to the Fermi level in the source and drain.
Figure 7C:
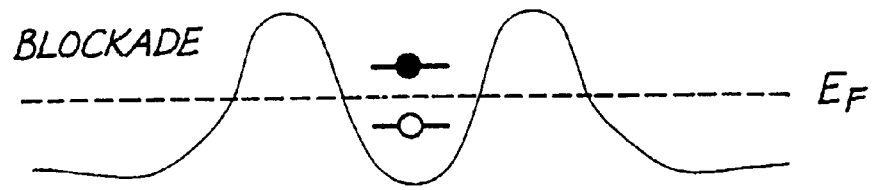

If the nuclear spin degeneracy is broken because of A-gate biases, see FIG. 6, as was done above for electron spin, then whether or not the system evolves into a singlet is entirely determined by the initial spin state of the nuclear spin with the larger splitting. Thus, for the coupled electron-nuclear spin system, a single measurement can determine the spin state of a chosen nuclear spin. In FIG. 6 the solid lines represent the electron energy levels as a function of E. The dashed lines represent the lowest energy-coupled electron-nuclear energy levels as a function of E. The electron energy levels behave as in FIG. 4, Measuring the Spin State using a Single Electron Tunnelling Transistor Single electron tunnelling transistors (SETTs)are currently the most sensitive devices developed to measure small charges and small charge motions. SETTs contain a small "island" electrode 9 located between source 10 and drain 11 electrodes, as illustrated in FIG. 7*a*). Current flows from source 10 to drain 11 only if there is an energy level in the island 9 equal to the Fermi level in the source 10 and drain 11, as shown in FIG. 7*b*. The "Coulomb blockade", as illustrated in FIG. 7*c,* results when no energy level is available on the island through which the electrons can tunnel. The extreme sensitivity of SETTs will occur when the island 9 is extremely small and when the device is at low temperature.

For spin detection, designs can readily be implemented, including the three gate structure shown in FIG. 3, where one of the A-gates is also the island of a SETT. In the scenario where the devices discussed above are used to measure and initialize spins in a quantum computer, many SETTs would be necessary to measure many spins simultaneously. The capacitive coupling technique for spin measurement is particularly attractive, since a two dimensional array of spins could be measured using electrodes out of the plane of the spins, and every spin in the array could be independently measured by a separate SETT device. Thus, this approach to spin measurement is well suited to future large scale quantum computation.

Such a quantum computer could comprise a Si substrate into which an array of donor atoms of $^{31}$P are introduced 200 Å beneath the surface. The atoms are separated by less than 200 Å. Conducting A-gates are laid down on a SiO$_2$ insulating layer above the Si substrate, each A-gate being directly above a respective $^{31}$P atom. Conducting E-gates are laid down on the insulating layer between each cell.

The nuclear spins of the donor atoms are the quantum states or "qubits" in which quantuminformation is stored and manipulated. The A-gates control the resonance frequency of the nuclear spin qubits, while E-gates control the electron-mediated coupling between adjacent nuclear spins.

In operation, the device is cooled to a temperature of T=50 mK. Also, a constant magnetic field of B=2T is applied to break the two-fold spin degeneracy. The combined effect is that the electrons only occupy the nondegenerate lowest spin energy level. The electrons must remain in a zero entropy ground state throughout a computation.

An electric field applied at the A-gate to the electron-donor system shifts the electron wave function envelope away from the nucleus and reduces the hyperfine interaction. A donor nuclear spin-electron system close to an A-gate functions as a voltage controlled oscillator: the precession frequency of the nuclear spin can be controlled externally, and spins can be selectively brought into resonance with an externally applied alternating magnetic field, $B_{AC}=10^{-3}$T, allowing arbitrary rotations to be performed on the nuclear spin.

Coupling between two donor-electron spin systems will arise from the electron spin exchange interaction when the donors are sufficiently close to each other. Significant coupling between nuclei will occur when the separation between donors is about 100–200 Å.

For two electron systems the exchange interaction lowers the electron singlet ($|\uparrow\downarrow-\downarrow\uparrow>$) energy with respect to the triplets. In a magnetic field, however, the electron ground state will be polarised if $\mu_B B > 2J$. The nuclear singlet $|10-01>$ (spins 180° out of phase) is lowered in energy with respect to $|10+01>$ (spins in phase). The other two triplet states are higher and lower than these states.

When the voltages of the A-gates is not equal the nuclear spin singlets and triplets are no longer eigenstates, and the eigenstates of the central levels will approach $|10>$ and $|01>$ when the voltage difference is large enough.

Control of the E-gates, combined with control of A-gates and application of $B_{AC}$, are sufficient to effect the controlled rotation operation between two adjacent spins. The action of A-gates and E-gates, together with $B_{AC}$ perform all of the reversible operations for quantum computation.

Constructing the Electron Devices

The materials used to build such electron devices must be almost completely free of spin (I=/0 isotopes) and charge impurities in order to prevent dephasing fluctuations from arising within it. Donors must be introduced into the material hundreds of Å beneath the surface. Finally, the gates with lateral dimensions and separations <100 Å must be patterned on the surface, registered to the donors beneath them. Each of these are the focus of intense current research in the rapidly moving field of semiconductor growth and nanofabrication. This research bears directly on the problems of making a nuclear spin quantum computer in silicon.

An excellent indicator of suitable semiconductor materials is the ability to observe integral and fractional quantum Hall effects in them. In particular, the spin detection techniques outlined above require that electrons can be fully spin polarised, a condition which leads to quantisation of the Hall effect at integers corresponding to the spin gap. This condition is well satisfied in high mobility $GaAs/Al_xGa_{1-x}As$ heterostructures, where nuclear spin sensing electronics have been demonstrated. Absence of I=0 isotopes, however, in these materials means that making an electron device from them is highly unlikely. Recent advances in $Si/Si_xGe_{1-x}$ heterostructures have led to materials composed entirely of group IV elements with quality comparable to GaAs heterostructures. The fractional quantum Hall effect is observed in these materials and spin splitting is well resolved. Nanostructures have also been fabricated on high quality $Si/Si_xGe_{1-x}$ heterostructures.

While the quality of $Si/SiO_2$ interfaces and the electron systems confined there is less than that of epitaxial interfaces, spin splittings are well resolved at low temperatures. The much larger barrier height in $SiO_2$ over $Si/Si_xGe_{1-x}$ (3.3V vs.~0.2 V) is a critical advantage in nanostructures with sizes of 100 Å or less. Leakage of electrons across the barrier material, resulting in the removal of an electron from a donor state, is a source of decoherence in the quantum computer not mentioned previously. Electrons consequently must not tunnel across the barrier during the computation. Also, the ability of E-gates to vary the exchange interaction over a large dynamic range will improve in devices with large barrier heights. Technologies being developed for electronics applications may result in structures with both the high interface quality of $Si/Si_xGe_{1-x}$ and the larger tunnel barrier of $SiO_2$. Because of charge fluctuations and disorder, it is likely that bulk and interface states in $SiO_2$ will need to be reduced or eliminated if an electron device is to be fabricated using $SiO_2$.

The most obvious obstacle to building the electron devices presented above is the incorporation of the donor array into the Si layer beneath the barrier layer. Currently semiconductor heterostructures are deposited layer by layer. The δ-doping technique produces donors lying on a plane in the material, with the donors randomly distributed within the plane. The electron devices envisioned require that the donors be placed into an ordered array making it extremely difficult to create the array by using lithography and ion implantation or by focused deposition. Methods currently under development to place single atoms on surfaces using ultra high vacuum scanning tunnelling microscopy are likely candidates to be used to position the donor array. This approach has been used to place Ga atoms on a Si surface. A challenge will be to grow high quality Si layers on the surface subsequent to placement of the donors.

Because the donors in the array must be <200 Å apart in order for exchange coupling between the electron spins to be significant, the gate dimensions must be <100 Å, although the separations may be larger if the E-gates are biased positively to reduce the barrier between donors. In addition, the gates must be accurately registered to the donors beneath them. Scanned probe lithography techniques have the potential to sense the location of the donors beneath the surface prior to exposing the gate patterns on the surface. For example, a scanning near field optical microscope could be used to detect the photoluminescence characteristic of the P donors in a wavelength range that does not expose photoresist. After P detection and proper positioning of the probe, the resist is exposed with a different light wavelength. "Custom patterning" of the gates may prove to be necessary to compensate for irregularities or defects in the placement of the donor array.

Many of the technical challenges facing the development of such electron devices are similar to those facing the next generation of conventional electronics; consequently, tremendous efforts are already underway to overcome these obstacles.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. An electron device for single spin measurement, comprising:

a semiconductor substrate into which at least one donor atom is introduced to produce a donor nuclear spin electron system having large electron wave functions at the nucleus of the donor atom;

an insulating layer above the substrate;

a first conducting gate on the insulating layer above the donor atom to control the energy of the bound electron state at the donor;

a second conducting gate on the insulating layer adjacent the first gate to generate at least one electron in the substrate;

wherein in use, a single electron is bound to the donor, and the donor atom is weakly coupled to the at least one electron in the substrate, the gates are biased so that the at least one electron in the substrate will move to the donor, but only if the spins of the at least one electron and the donor are in a relationship which permits the movement;

wherein the arrangement is such that detection of current flow, or even movement of a single electron, in the device constitutes a measurement of a single spin.

2. An electron device for single spin measurement according to claim 1, wherein the motion of a single electron is detected by probing the system capacitively.

3. An electron device for single spin measurement according to claim 1, wherein the charge motion is detected by single electron tunnelling transistor capacitance electrometry.

4. An electron device for single spin measurement, comprising:

a semiconductor substrate into which at least one donor atom is introduced to produce a donor nuclear spin electron system having large electron wave functions at the nucleus of the donor atom;

an insulating layer above the substrate;

a conducting A-gate on the insulating layer above the donor atom to control the energy of the bound electron state at the donor;

a conducting E-gate on the insulating layer on either side of the A-gate to generate a reservoir of spin polarised electrons at the interface between the substrate and the insulating layer;

wherein in use the donor atom is weakly coupled to the two reservoirs of spin-polarized electrons, both reservoirs have the same polarisation, and a single electron, whose spin is to be determined, is bound to the donor, the E-gates are biased so that current will flow between them, but only if the spin on the donor is opposite to the spin polarization in the reservoirs.

5. An electron device for single spin measurement according to claim 4, wherein there are two donors with 'A-gates' located above each of them, and an 'E-gate' located between them, electrons are bound to the two, positively charged, donors, and the donors are spaced sufficiently close to each other so that electron transfer, or exchange coupling, between them is possible;

wherein in use, an increasing potential difference is applied to the two A-gates and at some point it will become energetically favorable for both electrons to become bound to the same donor, but only if the electrons are in a mutual singlet state;

wherein the signature of the singlet state, charge motion between donors as a differential bias is applied to the A-gates, is then detected externally.

6. An electron device for single nuclear spin measurement, comprising:

a semiconductor substrate into which at least one donor atom is introduced to produce a donor nuclear spin electron system having large electron wave functions at the nucleus of the donor atom;

an insulating layer above the substrate;

a conducting A-gate on the insulating layer above the donor atom to control the energy of the bound electron state at the donor;

a conducting E-gate on the insulating layer on either side of the A-gate to generate a reservoir of electrons at the interface between the substrate and the insulating layer;

wherein in use all the electron spins are polarized in the same direction, and the donor is a nucleus with spin, coupled to the electrons by the hyperfine interaction, and the E-gates are biased so that current will flow between them, but only if the the nuclear spin is initially opposed to the electron spins.

7. An electron device for single spin measurement according to claim 6, wherein a current flow across the donor preserves nuclear spin polarisation, and current flow is turned on or off depending on the orientation of the nuclear spin on the donor.

8. An electron device for single spin measurement according to any preceding claim, wherein the electrons are polarised by being at low temperature in a large magnetic field.

9. An election device for single spin measurement according to any one of claims 1 through 7, wherein conducting E-gates are located on the insulating layer on either side of the A-gate and generate a 2-Dimensional electron gas at the interface between the substrate and the insulating layer.

10. An electron device for single spin measurement according to claim 9, wherein in use, the E-gates are biased so that only $|\downarrow>$ electrons are present on both sides of the donor atom, and the A-gate are biased so that $E_F$ lies at the energy of the two electron bound state at the donor.

11. An electron device for spin measurement according to any one of claims 1 through 7, wherein the host contains only nuclei with spin I=0.

12. An electron device for single spin measurement according to claim 11, wherein the host contains Group IV semiconductors composed primarily of I=0 isotopes and purified to contain only I=0 isotopes.

13. an electron device for spin measurement according to any one of claims 1 through 7, wherein Si is the semiconductor host.

14. An electron device for single spin measurement according to claim 13, wherein the donor is $^{31}P$.

15. An electron device single spin measurement according to any one of claims 1 through 7, wherein the gates are formed from metallic strips patterned on the surface of the insulating layer.

16. An electron device for single spin measurement according to claim 15, wherein there is a step in the insulating layer over which the gates cross to localise the gates electric fields in the vicinity of the donor atoms.

17. An electron device for single spin measurement according to any one of claims 1 through 7, wherein the spin system is prepared by adiabatic changes to the spin state energies before the measurement takes place, to insure that the measurement outcome is determined by the initial state of a given spin.

18. A quantum computer, comprising:

a semiconductor substrate into which donor atoms are introduced to produce an array of donor nuclear spin electron systems having large electron wave functions at the nucleus of the donor atoms;

an insulating layer above the substrate;

conducting A-gates on the insulating layer above respective donor atoms to control the strength of the hyperfine interactions between the donated electrons and the donor atoms' nuclear spins, and hence the resonance frequency of the nuclear spins of the donor atoms;

conducting J-gates on the insulating layer between A-gates to turn on and off electron mediated coupling between the nuclear spins of adjacent donor atoms;

wherein, the nuclear spins of the donor atoms are the quantum states or "qubits" in which binary information is stored and manipulated by selective application of voltage to the A-and J-gates and selective application of the alternating magnetic field to the substrate;

and additionally comprising an electron device for single spin measurement.

19. The quantum computer according to claim 18, further comprising: a cooling means to maintain the substrate cooled to a temperature sufficiently low.

20. The quantum computer according to claim 18 or 19, further comprising:

a source of constant magnetic field having sufficient strength to break the two-fold spin degeneracy of the bound state of the electron at the donor.

21. The quantum computer according to claim 18 or 19, further comprising:

a source of alternating magnetic field of sufficient force to flip the nuclear spin of donor atoms resonant with the field, and means to selectively apply the alternating magnetic field to the substrate.

22. The quantum computer according to claim 18 or 19, further comprising:

means to selectively apply voltage to the A-and J-gates.

23. The quantum computer according to claim 18 or 19, wherein where the E-gates are incorporated into the J-gates.

24. The quantum computer according to 18 or 19, wherein where one of the A-gates is also the island of a SETT.

25. A procedure for the preparation of spin states in a two electron system using a device according to any one of claims 4, 6, 7, 9 and 10, which comprises the following steps:

first, manipulating the A-gates so that a first spin has larger energy than a second spin;

next, apply bias to the intermediary E-gate to turn on the exchange coupling between the two electrons so that as the exchange coupling increases, the lower energy state of the two states with a single spin pointing up evolves into the singlet state which at large E will have the lowest energy;

then, bringing the A-gates back into balance so that the ground state is an exact singlet;

and, measuring for a singlet state.

26. A procedure for the preparation of spin states in a two electron system according to claim 25, where the state of the first spin is unknown, comprising the steps of:

performing two measurements in sequence on the spins, with the second beginning with a spin flip of the first spin.

* * * * *